United States Patent
Huang

(10) Patent No.: US 11,953,550 B2
(45) Date of Patent: Apr. 9, 2024

(54) SERVER JTAG COMPONENT ADAPTIVE INTERCONNECTION SYSTEM AND METHOD

(71) Applicant: INSPUR SUZHOU INTELLIGENT TECHNOLOGY CO., LTD., Jiangsu (CN)

(72) Inventor: Yanpo Huang, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 10 days.

(21) Appl. No.: 17/923,669

(22) PCT Filed: Feb. 19, 2021

(86) PCT No.: PCT/CN2021/076838
§ 371 (c)(1),
(2) Date: Nov. 7, 2022

(87) PCT Pub. No.: WO2021/248933
PCT Pub. Date: Dec. 16, 2021

(65) Prior Publication Data
US 2023/0184831 A1 Jun. 15, 2023

(30) Foreign Application Priority Data

Jun. 12, 2020 (CN) .......................... 202010537994.6

(51) Int. Cl.
*G01R 31/3185* (2006.01)
*G01R 31/317* (2006.01)
(52) U.S. Cl.
CPC ................ *G01R 31/318594* (2013.01); *G01R 31/31713* (2013.01); *G01R 31/318536* (2013.01)

(58) Field of Classification Search
None
See application file for complete search history.

(56) References Cited

U.S. PATENT DOCUMENTS

| 6,754,760 B1 * | 6/2004 | Yee ..................... G06F 13/4018 710/11 |
| 7,191,265 B1 * | 3/2007 | De Angeli ..... G01R 31/318572 714/724 |

(Continued)

FOREIGN PATENT DOCUMENTS

| CN | 101324653 A | 12/2008 |
| CN | 101937382 A | 1/2011 |

(Continued)

OTHER PUBLICATIONS

PCT/CN2021/076838, International Search Report, dated Apr. 27, 2021. English Translation.

(Continued)

*Primary Examiner* — Mujtaba M Chaudry
(74) *Attorney, Agent, or Firm* — Cooper Legal Group, LLC

(57) ABSTRACT

A server Joint Test Action Group (JTAG) component adaptive interconnection system and method. The system includes a JTAG master device, a programmable device, and a plurality of JTAG components. The programmable device is configured to simulate JTAG timing according to a JTAG protocol and test JTAG channels of the JTAG components connected to the programmable device one by one. The programmable device connects in series a Test Data Output (TDO) signal of a previous JTAG component with a Test Data Input (TDI) signal of a next JTAG component in the programmable device, connects a TDI signal of a first JTAG component with a TDI signal of the JTAG master device, and connects a TDO signal of a last JTAG component with (Continued)

a TDO signal of the JTAG master device, so as to form a JTAG interconnection chain.

20 Claims, 2 Drawing Sheets

(56) References Cited

U.S. PATENT DOCUMENTS

| | | | | |
|---|---|---|---|---|
| 7,383,478 | B1* | 6/2008 | Ballagh | H04W 24/00 |
| | | | | 714/727 |
| 10,608,640 | B1* | 3/2020 | Orthner | G06F 13/4282 |
| 2012/0243160 | A1* | 9/2012 | Nguyen | G06F 1/189 |
| | | | | 361/679.08 |
| 2014/0005992 | A1* | 1/2014 | Deindl | G06F 30/331 |
| | | | | 703/4 |
| 2015/0008954 | A1* | 1/2015 | Camarota | G01R 31/318516 |
| | | | | 324/762.03 |
| 2019/0289038 | A1* | 9/2019 | Li | H04L 9/3215 |

FOREIGN PATENT DOCUMENTS

| | | |
|---|---|---|
| CN | 102436385 A | 5/2012 |
| CN | 103033736 A | 4/2013 |
| CN | 104111400 A | 10/2014 |
| CN | 105548863 A | 5/2016 |
| CN | 111752780 A | 10/2020 |

OTHER PUBLICATIONS

PCT/CN2021/076838, Written Opinion, dated Apr. 27, 2021. English Translation.

* cited by examiner

SERVER JTAG COMPONENT ADAPTIVE INTERCONNECTION SYSTEM AND METHOD

This application claims priority to Chinese Patent Application No. 202010537994.6, filed on Jun. 12, 2020, in China National Intellectual Property Administration and entitled "Server JTAG Component Adaptive Interconnection System and Method", which is hereby incorporated by reference in its entirety.

FIELD

The present disclosure relates to the technical field of server Joint Test Action Group (JTAG) chain design, and particularly to a server JTAG component adaptive interconnection system and method.

BACKGROUND

With the development of technologies, a scale of a hardware server increases currently, and each system, main board, daughter card, and back-plane are configured flexibly and diversely. For example, specific system configurations, such as whether to install a daughter card at a certain slot and a specific model number of the daughter card to be installed, are variable. Therefore, it is quite difficult to connect all components supporting JTAG into a JTAG chain.

In the prior art, a JTAG master device connects a Platform Controller Hub (PCH), Central Processing Unit (CPU)/Processor 0, and CPU1 through a JTAG chain. In the chain, level conversion is implemented by a plurality of level conversion chips. Such a JTAG chain may connect to the PCH, CPU0, and CPU1 only, covering few devices, and components supporting JTAG may not be connected to the JTAG chain adaptively according to a system board configuration. There are a plurality of level converters, such that the cost is relatively high. Wiring needs to be designed according to a daisy chain, thus a design requirement for a Printed Circuit Board (PCB) is high. The JTAG chain is unable to select a proper rate automatically, and an excessively high rate makes it impossible for the JTAG chain to implement scan-through and test.

The prior art mainly has the following shortcomings. The JTAG chain covers few components only, including the PCH, CPU0, and CPU1, and it is impossible to connect a plurality of components to the JTAG chain adaptively. It is quite difficult to wire and lay out the JTAG chain. Many discrete devices are used, thus the hardware cost is high. The JTAG chain is unable to select a proper rate automatically.

SUMMARY

For the problems of low coverage rate of JTAG components in a system, high difficulty in hardware design, and incapability of a JTAG chain in selecting a proper rate adaptively, the present disclosure provides a server JTAG component adaptive interconnection system and method.

The technical solution of the present disclosure is as follows.

In a first aspect, the technical solution of the present disclosure provides a server JTAG component adaptive interconnection system, including a JTAG master device, a programmable device, and a plurality of JTAG components.

The plurality of JTAG components are connected with the programmable device respectively.

The programmable device is configured to simulate JTAG timing according to a JTAG protocol, test JTAG channels of the JTAG components connected to the programmable device one by one, and connect the JTAG components tested as normal, wherein a Test Data Output (TDO) signal of a previous JTAG component is connected in series with a Test Data Input (TDI) signal of a next JTAG component in the programmable device, a TDI signal of a first JTAG component is connected with a TDI signal of the JTAG master device, and a TDO signal of a last JTAG component is connected with a TDO signal of the JTAG master device, so as to form a JTAG interconnection chain. The programmable device detects JTAG components on a server, and adds the JTAG components to a JTAG chain.

Further, the programmable device is further configured to perform pressure testing on a JTAG test chain formed by testing the JTAG channels. The programmable device connects the TDO signal of the previous JTAG component determined as normal by pressure testing in series with the TDI signal of the next JTAG component in the programmable device, a Complex Programmable Logic Device (CPLD), and connects the TDI signal of the first JTAG component and the TDO signal of the last JTAG component with the TDI and TDO signals of the JTAG master device respectively, so as to form the JTAG interconnection chain.

Further, the programmable device is specifically configured to simulate the JTAG timing, switch a JTAG Test Access Port (TAP) state machine of each JTAG component connected to the programmable device to a shift Instruction Register (shift-IR) state one by one, and input a BYPASS instruction to the corresponding JTAG component, and is further configured to simulate the JTAG timing, switch the JTAG TAP state machine of the corresponding JTAG component to the shift-DR state, and send out a TDI signal of the corresponding JTAG component from TDO after a Test Clock (TCK) tick to form the JTAG test chain. The programmable device simulates the JTAG timing, and sends Test Mode Selection (TMS), Test Reset (TRST), TCK, and TDI signals to test the JTAG components connected to the programmable device one by one.

Further, the programmable device is configured to input a serial data code stream to the tested JTAG component through the TDI according to a TCK tick, then receive serial data output through the TDO according to the TCK tick, and compare the serial data code stream input through the TDI with the received serial data output through the TDO to determine whether the JTAG test chain is normal. A JTAG component whose channel is abnormal may have a hardware failure, or may be not in position. The programmable device is further configured to, in response to pressure testing being performed on the JTAG test chain, send data code streams at different rates to determine a maximum rate supported by the JTAG interconnection chain. The programmable device selects different rates in detection to recognize a maximum JTAG rate that may be supported in the chain, and adjusts the maximum rate of the chain to a minimum value of maximum rates supported by all the JTAG components on the chain or a lower rate.

Further, the JTAG master device is connected with the programmable device through a JTAG signal interface, and is configured to control the programmable device to add or remove, any JTAG component, to or from the JTAG interconnection chain.

The JTAG master device is connected with the programmable device through a communication interface, is configured to test the JTAG interconnection chain of a server through an adaptive interconnection established by the programmable device, and is further configured to read information about the JTAG interconnection chain in the programmable device through the communication interface.

In a second aspect, the technical solution of the present disclosure provides a server JTAG component adaptive interconnection method, including following steps:

by a programmable device, simulating JTAG timing according to a JTAG protocol, and testing JTAG channels of JTAG components connected to the programmable device one by one to form a JTAG test chain; and connecting the JTAG components tested as normal to form a JTAG interconnection chain, wherein a TDO signal of a previous JTAG component is connected in series with a TDI signal of a next JTAG component in the programmable device, a TDI signal of a first JTAG component is connected with a TDI signal of a JTAG master device, and a TDO signal of a last JTAG component is connected with a TDO signal of the JTAG master device, so as to form the JTAG interconnection chain.

Further, before the step of connecting the JTAG components tested as normal to form the JTAG interconnection chain, the method further includes:

performing, by the programmable device, pressure testing on the JTAG test chain formed by testing the JTAG channels.

Further, the step of by the programmable device, simulating JTAG timing according to the JTAG protocol and testing the JTAG channels of the JTAG components connected to the programmable device one by one includes:

by the programmable device, simulating the JTAG timing, switching a JTAG TAP state machine of each JTAG component connected to the programmable device to a shift-IR state one by one, and inputting a BYPASS instruction to the corresponding JTAG component, whereby a shortest serial path is formed between the TDI and the TDO of each JTAG component; and by the programmable device, simulating the JTAG timing, switching the JTAG TAP state machine of the corresponding JTAG component to the shift-DR state, and sending out a TDI signal of the corresponding JTAG component from the TDO after a TCK tick to form the JTAG test chain.

Further, the step of performing, by the programmable device, pressure testing on the JTAG test chain formed by testing the JTAG channels includes:

inputting, by the programmable device, a serial data code stream to the tested JTAG component through the TDI according to a TCK tick; then receiving serial data output through the TDO according to the TCK tick;

comparing the serial data code stream input through the TDI with the received serial data output through the TDO; and in response to the serial data code stream being consistent with the serial data, determining that the JTAG test chain is normal, otherwise in response to the serial data code stream not being consistent with the serial data, determining that the JTAG test chain is abnormal.

Further, the step of performing, by the programmable device, pressure testing on the JTAG test chain formed by testing the JTAG channels further includes:

in response to pressure testing being performed on the JTAG test chain, sending data code streams at different rates to determine a maximum rate supported by the JTAG interconnection chain.

It can be seen from the above technical solution that the present disclosure has the following advantages. 1) No level converter is needed, whereby the hardware cost is reduced. 2) A JTAG daisy chain design is simplified into a point-to-point design, whereby the design complexity is reduced. 3) The components are adaptively added to the JTAG chain, whereby the design difficulty and manual intervention are reduced. 4) The programmable device may be controlled through the communication interface between the JTAG master device and the programmable device to add, to the JTAG chain, or remove, from the JTAG chain, any component. 5) The coverage rate of a JTAG test tool is increased, and applications to research and development tests and production tests may be implemented to improve the research and development test efficiency and the yield.

In addition, the present disclosure is reliable in design principle and simple in structure, and has broad application prospect.

Thus it can be seen that, compared with the prior art, the present disclosure has outstanding substantial characteristics and significant improvements, as well as obvious implementation beneficial effects.

BRIEF DESCRIPTION OF THE DRAWINGS

To describe the technical solution in embodiments of the present disclosure or the prior art more clearly, the drawings required to be used in descriptions about the embodiments or the prior art will be introduced briefly below. Apparently, those ordinarily skilled in the art may further obtain other drawings according to these drawings without creative work.

DETAILED DESCRIPTION

Figure 1:
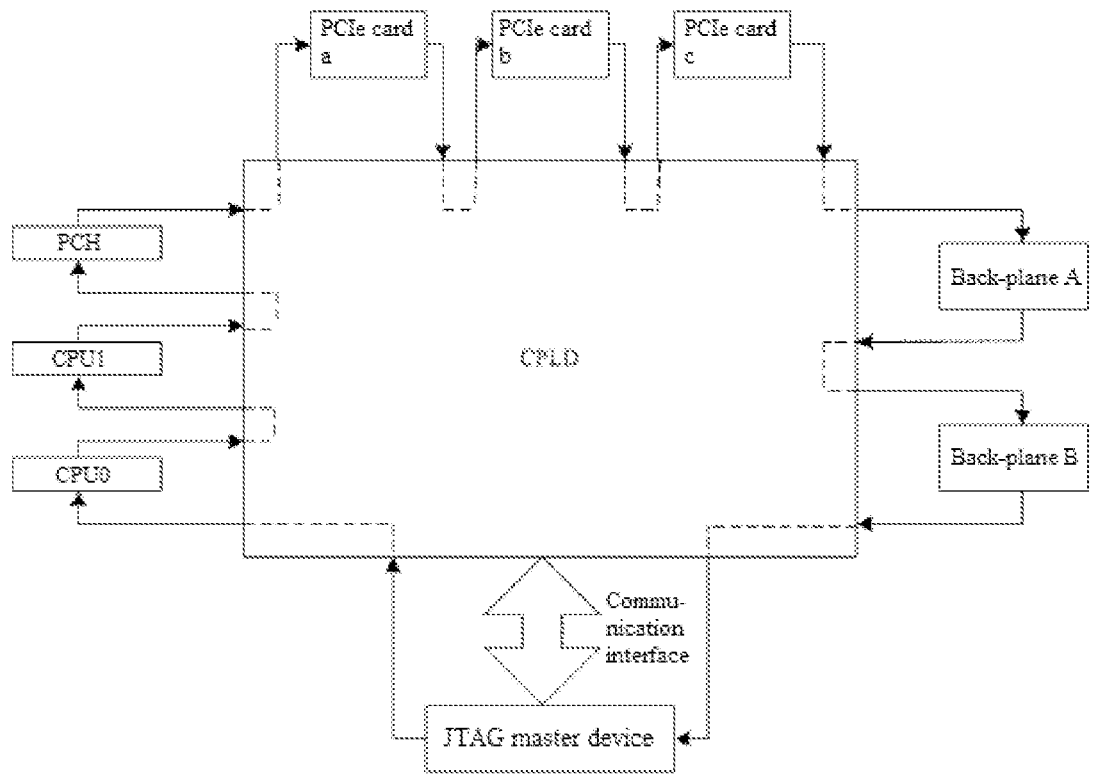
FIG. 1 is a schematic diagram of a processing mode for TDI and TDO signals in a programmable device according to an embodiment of the present disclosure.

To make the technical solution in the present disclosure understood better by those skilled in the art, the technical solution in the embodiments of the present disclosure will be described clearly and completely below in combination with the drawings in the embodiments of the present disclosure. Clearly, the described embodiments are not all but merely some of the embodiments of the present disclosure. All other embodiments obtained by those ordinarily skilled in the art based on the embodiments in the present disclosure without creative work shall fall within the scope of protection of the present disclosure.

CPLD is an abbreviation of Complex Programmable Logic Device.

JTAG is an abbreviation of Joint Test Action Group, an international standard test protocol (compatible with Institute of Electrical and Electronics Engineers (IEEE) 1149.1) mainly for tests in chips.

TAP is an abbreviation of Test Access Port.

Shift-DR is an abbreviation of shift Data Register, a DR shift state, which is a state in a TAP controller state machine jump map. In this state, in each clock cycle, a DR connected between TDI and TDO is driven by a TCK to receive 1 bit data from TDI and simultaneously output 1 bit data through TDO.

IO is an abbreviation of Input/Output.

TDI refers to test data input. Data is input to a JTAG port via TDI.

TDO refers to test data output. Data is output from the JTAG port via TDO.

TMS refers to test mode selection. TMS is used to set the JTAG port in a specific test mode.

TRST refers to test reset, an input pin. This pin is effective at a low level and optional.

TCK refers to test clock input.

BYPASS instruction and BYPASS register: the BYPASS register is a 1-bit shift register.

Embodiment 1

The embodiment of the present disclosure provides a server JTAG component adaptive interconnection system, including a JTAG master device, a programmable device, and a plurality of JTAG components.

The plurality of JTAG components are connected with the programmable device respectively.

The programmable device is configured to simulate JTAG timing according to a JTAG protocol, test JTAG channels of the JTAG components connected to the programmable device one by one, and connect the JTAG components tested as normal, wherein a TDO signal of a previous JTAG component is connected in series with a TDI signal of a next JTAG component in the programmable device, a TDI signal of a first JTAG component is connected with a TDI signal of the JTAG master device, and a TDO signal of a last JTAG component is connected with a TDO signal of the JTAG master device, so as to form a JTAG interconnection chain. The programmable device detects JTAG components on a server, and adds the JTAG components to the JTAG chain.

Embodiment 2

In the present embodiment, detailed descriptions are made taking a CPLD as the programmable device. The embodiment of the present disclosure provides a server JTAG component adaptive interconnection system, including a JTAG master device, a CPLD, and a plurality of JTAG components.

The plurality of JTAG components are connected with the CPLD respectively.

The CPLD is configured to simulate JTAG timing according to a JTAG protocol, test JTAG channels of the JTAG components connected to the CPLD one by one, and connect the JTAG components tested as normal, wherein a TDO signal of the previous JTAG component is connected in series with a TDI signal of the next JTAG component in the CPLD, a TDI signal of the first JTAG component is connected with a TDI signal of the JTAG master device, and a TDO signal of the last JTAG component is connected with a TDO signal of the JTAG master device, so as to form a JTAG interconnection chain. It is to be noted that the TDI signal of the JTAG master device is actually an output signal when the TDI signal of the first JTAG component is connected with the TDI signal of the JTAG master device, and the TDO signal of the JTAG master device is actually an input signal when the TDO signal of the last JTAG component is connected with the TDO signal of the JTAG master device.

It is to be noted that the CPLD is further configured to perform pressure testing on a JTAG test chain formed by testing the JTAG channels. The CPLD connects a TDO signal of the previous JTAG component determined as normal by pressure testing in series with a TDI signal of the next JTAG component in the CPLD, connects a TDI signal of the first JTAG component with the TDI signal of the JTAG master device, and connects a TDO signal of the last JTAG component with the TDO signal of the JTAG master device, so as to form the JTAG interconnection chain.

The CPLD is specifically configured to simulate the JTAG timing, switch a JTAG TAP state machine of each JTAG component connected to the CPLD to a shift-IR state one by one, and input a BYPASS instruction to the corresponding JTAG component, and is further configured to simulate the JTAG timing, switch the JTAG TAP state machine of the corresponding JTAG component to the shift-DR state, and send out a TDI signal of the corresponding JTAG component from TDO after a TCK tick to form the JTAG test chain. The CPLD simulates the JTAG timing, and sends TMS, TRST, TCK, and TDI signals to test the JTAG components connected to the CPLD one by one. A BYPASS register may be connected between the TDI and the TDO through the BYPASS instruction. When no test is needed, the BYPASS register is connected between the TDI and the TDO to provide a shortest serial path between the TDI and the TDO.

The CPLD is configured to input a serial data code stream to the tested JTAG component through the TDI according to a TCK tick, then receive serial data output through the TDO according to the TCK tick, and compare the serial data code stream input through the TDI with the received serial data output through the TDO to determine whether the JTAG test chain is normal. A JTAG component whose channel is abnormal may have a hardware failure, or may be not in position. Here, the serial data code stream is specific serial data, which may be serial data where a plurality of continuous 0s jump to is and a plurality of continuous is jump to 0s, such as 0000 . . . 01 and 1111 . . . 10, or another more complex code form, whereby the pressure of the chain signal quality is increased.

The CPLD is further configured to, when pressure testing is performed on the JTAG test chain, send data code streams at different rates to determine a maximum rate supported by the JTAG interconnection chain. The CPLD selects different rates in detection to recognize a maximum JTAG rate that may be supported in the chain, and adjusts the maximum rate of the chain to a minimum value of maximum rates supported by all the JTAG components on the chain or a lower rate.

The JTAG master device is connected with the CPLD through a JTAG signal interface, and is configured to control the CPLD to add or remove, any JTAG component, to or from the JTAG interconnection chain.

The JTAG master device is connected with the CPLD through a communication interface, is configured to test the JTAG interconnection chain of a server through an adaptive interconnection established by the CPLD, and is further configured to read information about the JTAG interconnection chain in the CPLD through the communication interface.

Figure 2:
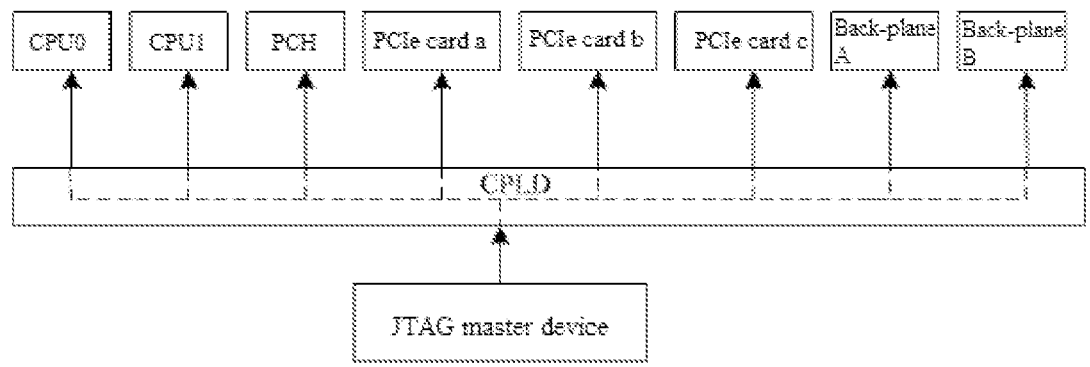
FIG. 2 is a schematic diagram of a processing mode for TMS, TRST, and TCK signals in a programmable device according to an embodiment of the present disclosure.

When the JTAG components include CPU0, CPU1, a PCH, a PCIe (a high-speed serial computer extended bus standard) card a, a PCIe card b, a PCIe card c, a back-plane A, and a back-plane B, through the above-mentioned process, a processing mode for TDI and TDO signals in the CPLD is shown in FIG. 1, and a processing mode for TMS, TRST, and TCK signals in the CPLD is shown in FIG. 2.

Figure 3:
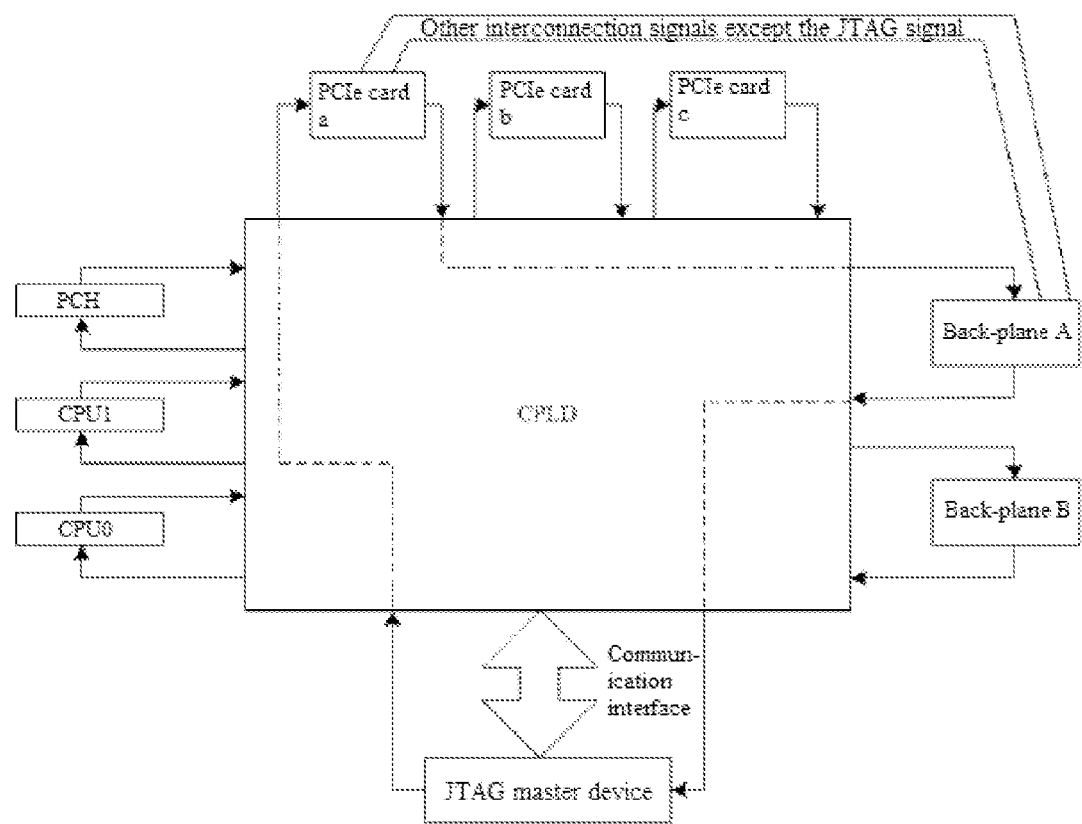
FIG. 3 shows a topology of TDI and TDO signals when a Peripheral Component Interconnect Express (PCIe) card a and a back-plane A are tested according to an embodiment of the present disclosure.
Figure 4:
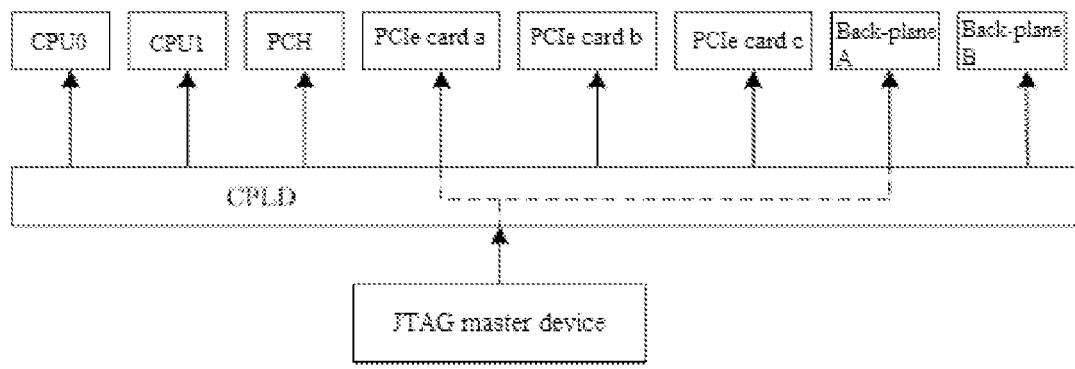
FIG. 4 shows a topology of TMS, TRST, and TCK signals when a PCIe card a and a back-plane A are tested according to an embodiment of the present disclosure.

When signals of any two JTAG components on the JTAG interconnection chain need to be tested, it is only necessary to simultaneously add the two corresponding components to the JTAG interconnection chain (the chain may not include the two components only) and start a JTAG test, thereby testing whether all interconnect signals in the two corresponding components are normal. FIG. 3 shows a topology of TDI and TDO signals when the PCIe card a and the back-plane A are tested. FIG. 4 shows a topology of TMS, TRST, and TCK signals when the PCIe card a and the back-plane A are tested.

Embodiment 3

The embodiment of the present disclosure also provides a server JTAG component adaptive interconnection method, including following steps:

a programmable device simulates JTAG timing according to a JTAG protocol, and tests JTAG channels of JTAG components connected to the programmable device one by one to form a JTAG test chain; and the JTAG components tested as normal are connected to form a JTAG interconnection chain, wherein a TDO signal of the previous JTAG component is connected in series with a TDI signal of the next JTAG component in the programmable device, a TDI signal of the first JTAG component is connected with a TDI signal of a JTAG master device, and a TDO signal of the last JTAG component is connected with a TDO signal of the JTAG master device, so as to form the JTAG interconnection chain.

Before the step that the JTAG components tested as normal are connected to form a JTAG interconnection chain, the method further includes the following step:

the programmable device performs pressure testing on the JTAG test chain formed by testing the JTAG channels.

It is to be noted that the step that a programmable device simulates JTAG timing according to a JTAG protocol and tests JTAG channels of JTAG components connected to the programmable device one by one includes the following steps:

the programmable device simulates the JTAG timing, switches a JTAG TAP state machine of each JTAG component connected to the programmable device to a shift-IR state one by one, and inputs a BYPASS instruction to the corresponding JTAG component, wherein a shortest serial path is formed in such case between TDI and TDO of each JTAG component; and the programmable device simulates the JTAG timing, switches the JTAG TAP state machine of the corresponding JTAG component to a shift-DR state, and sends out a TDI signal of the corresponding JTAG component from TDO after a TCK tick to form the JTAG test chain.

It is to be noted that the step that the programmable device performs pressure testing on the JTAG test chain formed by testing the JTAG channels includes the following steps:

the programmable device inputs a serial data code stream to the tested JTAG component through TDI according to a TCK tick; then serial data output through TDO is received according to the TCK tick;

the serial data code stream input through TDI is compared with the received serial data output through TDO; and if the serial data code stream is consistent with the serial data, it is determined that the JTAG test chain is normal, otherwise it is determined that the JTAG test chain is abnormal.

The step that the programmable device performs pressure testing on the JTAG test chain formed by testing the JTAG channels further includes the following step:

when pressure testing is performed on the JTAG test chain, data code streams are sent at different rates to determine a maximum rate supported by the JTAG interconnection chain.

In the above-mentioned embodiments, the programmable device may include a CPLD and a Field-Programmable Gate Array (FPGA), both of which fall within the scope of protection of the present disclosure. Although the present disclosure is described in detail with reference to the drawings and in combination with preferred embodiments, the present disclosure is not limited thereto. Those ordinarily skilled in the art may make various equivalent modifications or replacements without departing from the spirit and essence of the present disclosure. These modifications and replacements shall fall within the scope of the present disclosure, or any variations or replacements apparent to those skilled in the art within the technical scope disclosed in the present disclosure shall fall within the scope of protection of the present disclosure. Therefore, the scope of protection of the present disclosure shall be subject to the scope of protection of the claims.

What is claimed is:

1. A server Joint Test Action Group (JTAG) component adaptive interconnection system, comprising a JTAG master device, a programmable device, and a plurality of JTAG components, wherein the plurality of JTAG components are connected with the programmable device respectively; and the programmable device is configured to simulate JTAG timing according to a JTAG protocol, test JTAG channels of the plurality of JTAG components connected to the programmable device one by one, and connect JTAG components tested as normal, wherein a Test Data Output (TDO) signal of a previous JTAG component is connected in series with a Test Data Input (TDI) signal of a next JTAG component in the programmable device, a TDI signal of a first JTAG component is connected with a TDI signal of the JTAG master device, and a TDO signal of a last JTAG component is connected with a TDO signal of the JTAG master device, so as to form a JTAG interconnection chain.

2. The server JTAG component adaptive interconnection system according to claim 1, wherein the programmable device is further configured to perform pressure testing on a JTAG test chain formed by testing the JTAG channels.

3. The server JTAG component adaptive interconnection system according to claim 1, wherein the programmable device is specifically configured to simulate the JTAG timing, switch a JTAG Test Access Port (TAP) state machine of each JTAG component connected to the programmable device to a shift Instruction Register (shift-IR) state one by one, and input a BYPASS instruction to the corresponding JTAG component, and is further configured to simulate the JTAG timing, switch the JTAG TAP state machine of the corresponding JTAG component to a shift data register (shift-DR) state, and send out a TDI signal of the corresponding JTAG component from the TDO signal after a Test Clock (TCK) tick to form the JTAG test chain.

4. The server JTAG component adaptive interconnection system according to claim 3, wherein a BYPASS register is connected between the TDI signal and the TDO signal through the BYPASS instruction.

5. The server JTAG component adaptive interconnection system according to claim 1, wherein the programmable device is configured to input a serial data code stream to the tested JTAG component through the TDI signal according to a Test Clock (TCK) tick, then receive serial data output through the TDO signal according to the TCK tick, and compare the serial data code stream input through the TDI signal with serial data output through the TDO signal to determine whether the JTAG test chain is normal, and is further configured to, in response to pressure testing being performed on the JTAG test chain, send data code streams at different rates to determine a maximum rate supported by the JTAG interconnection chain.

6. The server JTAG component adaptive interconnection system according to claim 1, wherein the JTAG master device is connected with the programmable device through a JTAG signal interface, and is configured to control the programmable device to add or remove, any JTAG component, to or from the JTAG interconnection chain; and the JTAG master device is connected with the programmable device through a communication interface, is configured to test the JTAG interconnection chain of a server through an adaptive interconnection established by the programmable device, and is further configured to read information about the JTAG interconnection chain in the programmable device through the communication interface.

7. The server JTAG component adaptive interconnection system according to claim 1, wherein the programmable device is configured to simulate the JTAG timing, and send Test Mode Selection (TMS), Test Reset (TRST), Test Clock (TCK), and the TDI signals to test the plurality of JTAG components connected to the programmable device one by one.

8. The server JTAG component adaptive interconnection system according to claim 1, wherein the programmable device detects the plurality of JTAG components on a server, and adds the plurality of JTAG components to the JTAG interconnection chain.

9. A server Joint Test Action Group (JTAG) component adaptive interconnection method, comprising following steps:

by a programmable device, simulating JTAG timing according to a JTAG protocol, and testing JTAG channels of JTAG components connected to the programmable device one by one to form a JTAG test chain; and connecting JTAG components tested as normal to form a JTAG interconnection chain, wherein a Test Data Output (TDO) signal of a previous JTAG component is connected in series with a Test Data Input (TDI) signal of a next JTAG component in the programmable device, a TDI signal of a first JTAG component is connected with a TDI signal of a JTAG master device, and a TDO signal of a last JTAG component is connected with a TDO signal of the JTAG master device, so as to form the JTAG interconnection chain.

10. The server JTAG component adaptive interconnection method according to claim 9, wherein before the step of connecting the JTAG components tested as normal to form the JTAG interconnection chain, the method further comprises:

performing, by the programmable device, pressure testing on the JTAG test chain formed by testing the JTAG channels.

11. The server JTAG component adaptive interconnection method according to claim 10, wherein the step of performing, by the programmable device, pressure testing on the JTAG test chain formed by testing the JTAG channels comprises:

inputting, by the programmable device, a serial data code stream to the tested JTAG component through the TDI signal according to a Test Clock (TCK) tick; then receiving serial data output through the TDO signal according to the TCK tick;

comparing the serial data code stream input through the TDI signal with the serial data output through the TDO signal; and in response to the serial data code stream being consistent with the serial data, determining that the JTAG test chain is normal, otherwise in response to the serial data code stream not being consistent with the serial data, determining that the JTAG test chain is abnormal.

12. The server JTAG component adaptive interconnection method according to claim 10, wherein the step of performing, by the programmable device, pressure testing on the JTAG test chain formed by testing the JTAG channels further comprises:

in response to pressure testing being performed on the JTAG test chain, sending data code streams at different rates to determine a maximum rate supported by the JTAG interconnection chain.

13. The server JTAG component adaptive interconnection method according to claim 9, wherein the step of by a programmable device, simulating JTAG timing according to a JTAG protocol and testing JTAG channels of JTAG components connected to the programmable device one by one comprises:

by the programmable device, simulating the JTAG timing, switching a JTAG Test Access Port (TAP) state machine of each JTAG component connected to the programmable device to a shift Instruction Register (shift-IR) state one by one, and inputting a BYPASS instruction to the corresponding JTAG component, whereby a shortest serial path is formed between a TDI and a TDO of each JTAG component; and by the programmable device, simulating the JTAG timing, switching the JTAG TAP state machine of the corresponding JTAG component to a shift data register (shift-DR) state, and sending out a TDI signal of the corresponding JTAG component from the TDO signal after a Test Clock (TCK) tick to form the JTAG test chain.

14. The server JTAG component adaptive interconnection method according to claim 9, wherein by the programmable device, simulating JTAG timing according to the JTAG protocol, and sending Test Mode Selection (TMS), Test Reset (TRST), Test Clock (TCK), and the TDI signals to test the JTAG channels of the JTAG components connected to the programmable device one by one.

15. A non-transitory computer-readable storage medium, storing a computer program that is executable by a processor, and upon execution by the processor, is configured to cause the processor to:

simulate JTAG timing according to a Joint Test Action Group (JTAG) protocol, and test JTAG channels of JTAG components connected to a programmable device one by one to form a JTAG test chain; and connect JTAG components tested as normal to form a JTAG interconnection chain, wherein a Test Data Output (TDO) signal of a previous JTAG component is connected in series with a Test Data Input (TDI) signal of a next JTAG component in the programmable device, a TDI signal of a first JTAG component is connected with a TDI signal of a JTAG master device, and a TDO signal of a last JTAG component is connected with a TDO signal of the JTAG master device, so as to form the JTAG interconnection chain.

16. The non-transitory computer-readable storage medium according to claim 15, wherein the computer program, upon execution by the processor, is further configured to cause the processor to:
simulate the JTAG timing according to the JTAG protocol, and send Test Mode Selection (TMS), Test Reset (TRST), Test Clock (TCK), and the TDI signals to test the JTAG channels of the JTAG components connected to the programmable device one by one.

17. The non-transitory computer-readable storage medium according to claim 15, wherein the computer program, upon execution by the processor, is further configured to cause the processor to:
before connecting the JTAG components tested as normal to form the JTAG interconnection chain, perform pressure testing on the JTAG test chain formed by testing the JTAG channels.

18. The non-transitory computer-readable storage medium according to claim 17, wherein the computer program, upon execution by the processor, is further configured to cause the processor to:
input a serial data code stream to a tested JTAG component through the TDI signal according to a Test Clock (TCK) tick; then receive serial data output through the TDO signal according to the TCK tick;
compare the serial data code stream input through the TDI signal with the serial data output through the TDO signal; and in response to the serial data code stream being consistent with the serial data, determine that the JTAG test chain is normal, otherwise in response to the serial data code stream not being consistent with the serial data, determine that the JTAG test chain is abnormal.

19. The non-transitory computer-readable storage medium according to claim 17, wherein the computer program, upon execution by the processor, is further configured to cause the processor to:
in response to the pressure testing being performed on the JTAG test chain, send data code streams at different rates to determine a maximum rate supported by the JTAG interconnection chain.

20. The non-transitory computer-readable storage medium according to claim 15, wherein the computer program, upon execution by the processor, is further configured to cause the processor to:
simulate the JTAG timing, switch a JTAG Test Access Port (TAP) state machine of each JTAG component connected to the programmable device to a shift Instruction Register (shift-IR) state one by one, and input a BYPASS instruction to the corresponding JTAG component, whereby a shortest serial path is formed between the TDI signal and the TDO signal of each JTAG component; and
simulate the JTAG timing, switch the JTAG TAP state machine of the corresponding JTAG component to a shift data register (shift-DR) state, and send out a TDI signal of the corresponding JTAG component from the TDO signal after a Test Clock (TCK) tick to form the JTAG test chain.

* * * * *